United States Patent [19]

Boll et al.

[11] 4,275,437
[45] Jun. 23, 1981

[54] SEMICONDUCTOR CIRCUIT FOR VOLTAGE CONVERSION

[75] Inventors: Harry J. Boll, Berkeley Heights; Dennis J. Lynes, Madison, both of N.J.

[73] Assignee: Bell Telephone Laboratories, Incorporated, Murray Hill, N.J.

[21] Appl. No.: 12,832

[22] Filed: Feb. 16, 1979

[51] Int. Cl.³ ............... H02M 3/155; H02M 7/155; H03K 5/02; H03K 3/353
[52] U.S. Cl. .............................. 363/60; 307/DIG. 4
[58] Field of Search ............... 307/264, 304, DIG. 1, 307/DIG. 4, 205, 296 A, 296 R; 363/59, 60

[56] References Cited

U.S. PATENT DOCUMENTS

| 3,824,447 | 7/1974 | Kuwabara | 307/DIG. 4 X |
|---|---|---|---|
| 4,000,412 | 12/1976 | Rosenthal et al. | 307/DIG. 1 X |
| 4,016,476 | 4/1977 | Morokawa et al. | 307/DIG. 1 X |
| 4,029,973 | 6/1977 | Kobayashi et al. | 307/DIG. 1 X |
| 4,053,821 | 10/1977 | Hose, Jr. et al. | 363/60 |
| 4,061,929 | 12/1977 | Asano | 363/60 X |
| 4,123,671 | 10/1978 | Aihara et al. | 307/264 X |
| 4,199,806 | 4/1980 | Patterson | 363/60 |

OTHER PUBLICATIONS

Markus, *Electronic Circuits Manual*, p. 139, McGraw-Hill Book Co.
Braslavskii et al., *Instruments and Experimental Techniques*; vol. 20, No. 4, pp. 1132, 1138–1140, 2/1978.

*Primary Examiner*—Larry N. Anagnos
*Attorney, Agent, or Firm*—David I. Caplan

[57] ABSTRACT

A voltage multiplier circuit, in MOS technology, is arranged whereby MOS capacitors are alternately connected together in parallel (charging phase) and series (multiplying phase). Each capacitor is provided with a separate input MOS transistor as well as a separate feedback loop from the output side of each capacitor to the gate electrode of its input MOS transistor. During the multiplying phase, each input transistor is turned "on" in response to the voltage supplied by each feedback loop, thereby connecting the capacitors in series.

18 Claims, 3 Drawing Figures

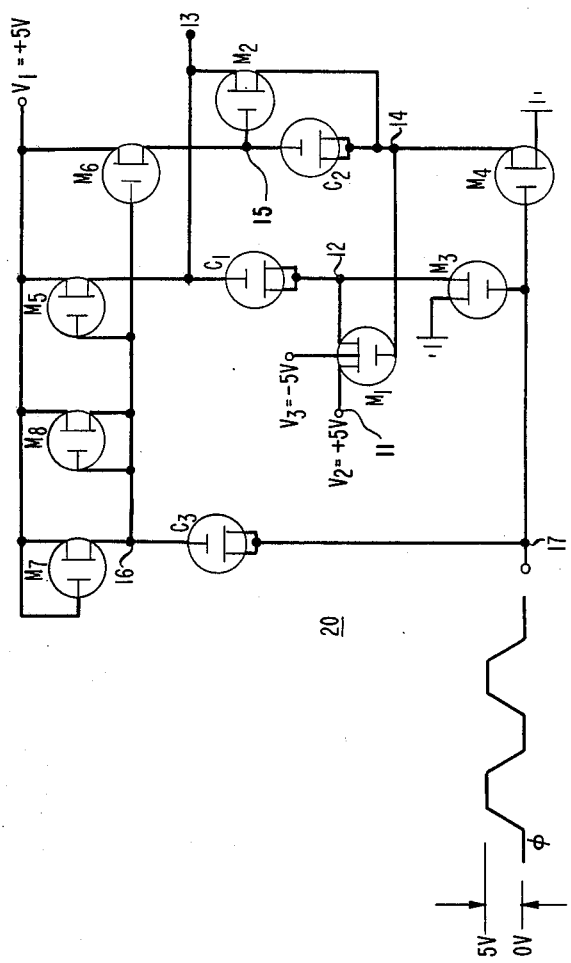
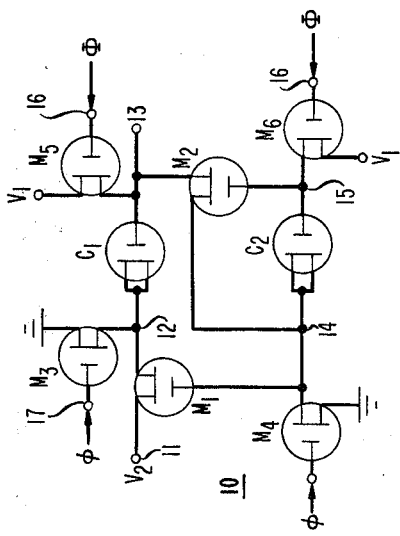
FIG. 2
FIG. 1

SEMICONDUCTOR CIRCUIT FOR VOLTAGE CONVERSION

FIELD OF THE INVENTION

This invention relates to the field of semiconductor apparatus and more particularly to MOS (metal-oxide-semiconductor) circuits for voltage conversion.

BACKGROUND OF THE INVENTION

In many practical applications involving electrical circuits in MOS technology, such as MOS memory and logic circuits, it is desired to have an on-chip MOS circuit for multiplying or "boosting" an applied external voltage. In prior art, such voltage multiplier circuits have taken such forms as "Jacobs ladders" (see, for example, John Markus, *Electronic Circuits Manual*, p. 139: "DC Voltage Converter"), as well as circuits in which capacitors are alternately connected in parallel and series, an external voltage being applied to each capacitor during the parallel connection phase (see, for example, L. M. Braslavskii et al., "Means of Transformerless Voltage Conversion and Construction of Transformerless Secondary Power Sources", *Instruments and Experimental Techniques*, Vol. 20. No. 4, pp. 1132–1140, at pp. 1138–1139). However, these prior art techniques suffer from undesirable threshold voltage drops across the various MOS diodes used in these circuits, thereby undesirably reducing the amount of voltage multiplication or, conversely, undesirably increasing the required number of capacitors and hence the required semiconductor chip area for a given desired voltage output, as well as causing undesirable power loss. It would therefore be desirable to have a voltage multiplier circuit in MOS technology which alleviates this problem.

In accordance with the invention, a stage (FIG. 1) of a voltage converter circuit includes a capacitor ($C_1$) having a pair of terminals each of which is connected through the source drain path of a separate MOS transistor switch ($M_3$, $M_5$) to a separate first and second voltage source terminal (ground, $V_1$) for alternately connecting and disconnecting said capacitor ($C_1$) to said first and second voltage source terminals (ground, $V_1$), one terminal of a capacitor ($C_1$) being also connected through the source-drain path of series-connected MOS transistor ($M_1$) to a second voltage source terminal ($V_2$), the gate electrode of said series-connected transistor ($M_1$) being connected to another MOS transistor switch ($M_4$) for alternately turning "on" and "off" said series-connected transistor ($M_1$), CHARACTERIZED IN THAT said circuit further includes a feedback loop running from the other terminal of said capacitor $C_1$ through a load ($M_2$) back to the gate electrode of said series connected MOS transistor ($M_1$). This load ($M_2$) advantageously is formed by the source-drain path of an MOS transistor whose gate electrode is connected through the source-drain path of MOS transistor switch ($M_6$) to a voltage source terminal and to one terminal of a second, smaller capacitor ($C_2$) having another terminal which is connected to the gate electrode of the series-connected transistor ($M_1$). Since it is the capacitor $C_1$ which consumes most of the semiconductor wafer area, the extra area consumed by the added elements of this invention is more than compensated by the higher output voltage, especially in multistage embodiments (FIG. 3) of this invention.

BRIEF DESCRIPTION OF THE DRAWINGS

This invention, together with its objects, features and advantages may be better understood from the following detailed description when read in conjunction with the drawings in which:

FIG. 1 is a schematic circuit diagram of a voltage converter circuit stage in MOS technology, in accordance with a specific embodiment of the invention;

FIG. 2 is a schematic circuit diagram of a voltage converter circuit stage in MOS technology, in accordance with another specific embodiment of the invention.

DETAILED DESCRIPTION

Figure 3:
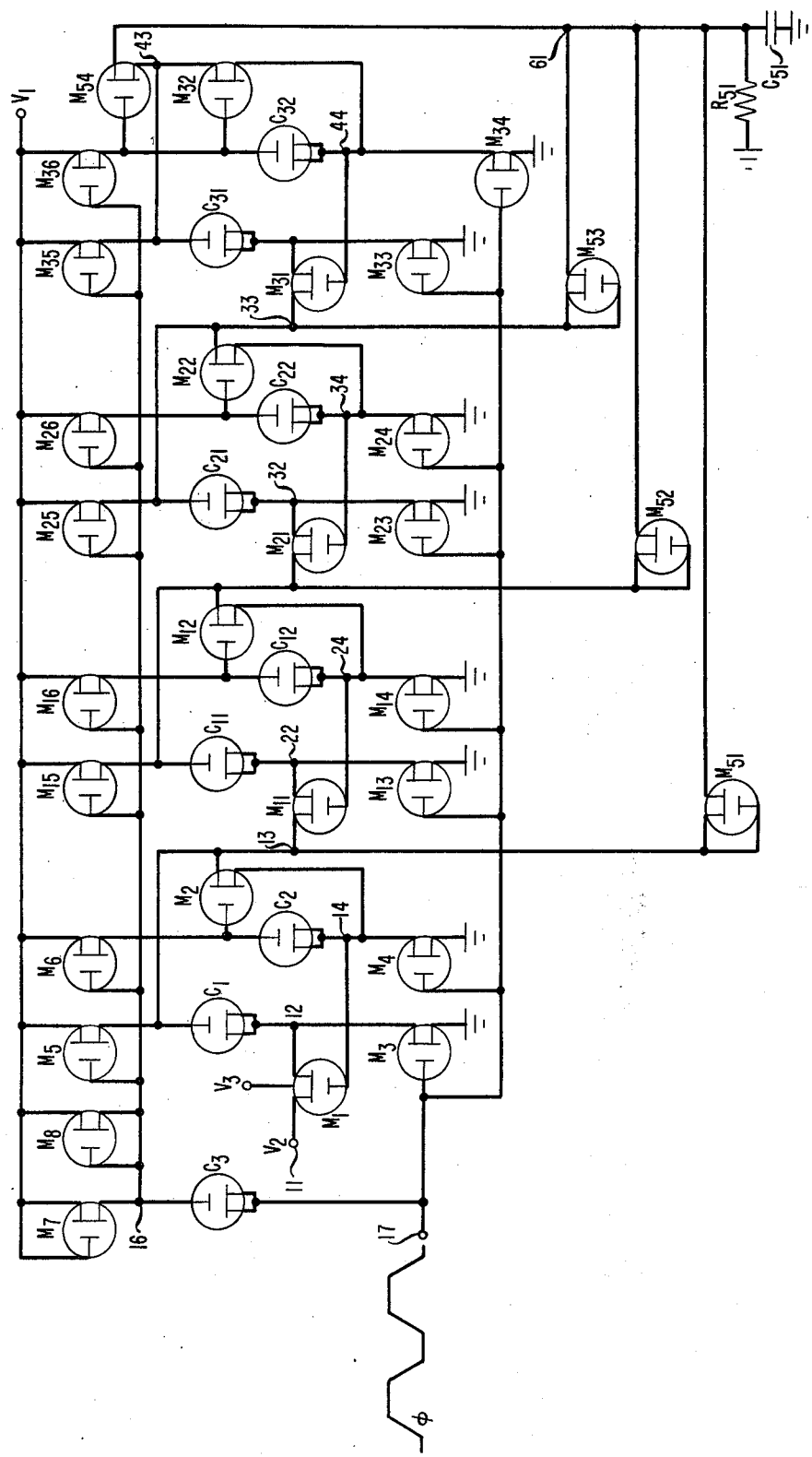
FIG. 3 is a schematic circuit diagram of a voltage multiplier in MOS technology in accordance with yet another specific embodiment of the invention.

A voltage converter circuit stage 10 in MOS technology is arranged (FIG. 1) as follows:

An input terminal 11 is connected to an output terminal 13 through the drain-source path of a first series connected MOS transistor $M_1$ connected in series with a first relatively large MOS capacitor $C_1$. A feedback loop comprises the drain-source path of a second, feedback MOS transistor $M_2$ which is connected between the output terminal 13 and the gate electrode of the first MOS transistor $M_1$. The gate electrode terminal 15 of the second MOS transistor $M_2$ is connected to its source terminal 14 through a relatively small feedback capacitor $C_2$. Auxiliary MOS switching transistors, $M_3$, $M_4$, $M_5$, and $M_6$ are controlled by periodic clock pulse input sequence $\phi$ (for $M_3$ and $M_4$) and $\Phi$ (for $M_5$ and $M_6$). These sequences $\phi$ and $\Phi$ are identical except for voltage levels as are suitable for periodically turning "on" and "off" simultaneously all of these auxiliary switching transistors $M_3$, $M_4$, $M_5$, and $M_6$. All of the transistors $M_1$–$M_6$ are typically of the enhancement mode N-MOS type. In this way, these auxiliary switching transistors periodically alternately connect and disconnect both capacitors ($C_1$, $C_2$) to a charging voltage $V_1$ relative to ground, typically about +5 volts (N-MOS) relative to ground. As a result only when these capacitors are disconnected from the charging voltage $V_1$, the series connected transistor $M_1$ is "on" due to feedback voltage to its gate electrode supplied through the feedback transistor $M_2$, thereby applying an input voltage $V_2$ to one terminal (12) of the first capacitor $C_1$ and thereby raising the potential of the output terminal 13 to the input voltage plus the charging voltage ($V_2+V_1$). In N-MOS technology, $V_2$ is positive.

The output potential ($V_2+V_1$) can be used as the input voltage (instead of $V_2$) to a similarly constructed second voltage converter circuit stage, whereby the output of this second stage will be ($V_2+2V_1$), and so forth for as many stages as desired. As further indicated in FIG. 2, the entire circuit 20 can be integrated in single semiconductor substrate biased at a voltage $V_3$ of typically −5 volts (back-gate bias).

During operation, the clock phase sequence $\phi$ alternately turns "on" and "off" the auxiliary MOS transistors $M_3$, $M_4$, $M_5$ and $M_6$. Thereby, the terminals 12 and 14 are alternately connected to and disconnected from ground potential, respectively, whereas the terminals 13 and 15 can thereby connected to and disconnected from a charging voltage $V_1$, typically about +5 volts in N-MOS technology (the semiconductor substrate bias being about −5 volts). During the "charging" phase when φ turns "on" the transistors $M_3$, $M_4$, $M_5$, and $M_6$, the series transistor $M_1$ is thus "off", since its gate electrode and drain terminal 12 are then both connected to ground, the voltage $V_2$ at the terminal 11 never being negative.

Accordingly, during the charging phase, the capacitor $C_1$ is disconnected from the input terminal 11. Advantageously, each of the capacitors $C_1$ and $C_2$ is formed by an MOS transistor whose source is permanently connected to its drain and whose gate electrode is connected to $V_1$ during the charging phase. Also, during this charging phase, the potential on both the gate electrode and drain of the feedback transistor $M_2$ is equal to $V_1$ while the potential on the source of this same transistor is at ground; therefore, the transistor $M_2$ is then "on" and supports a voltage of $V_1$ across its source-drain (channel) path. Accordingly, both the capacitors $C_1$ and $C_2$ are charged to a voltage of $V_1$ during the charging phase.

Just before the end of the charging phase, the auxiliary transistors $M_3$, $M_4$, $M_5$, and $M_6$ are all turned "off", thereby disconnecting the terminals 12 and 14 from ground and the terminals 13 and 15 from $V_1$. At this moment of time, moreover, the positive charge on the gate electrode of the feedback capacitor $C_2$ is still sufficient to keep the now floating terminal 15 at potential $V_1$ while the positive charge on the gate electrode of the large capacitor $C_1$ is still sufficient to keep the now floating terminal 13 at potential $V_1$; therefore, the feedback transistor $M_2$ remains in its "on" condition with terminal 14 at ground potential. As a result, positive charge flows through $M_2$ to terminal 14, thereby raising the potential of this latter terminal 14. Accordingly, after a short interval of time has thus elapsed just after the end of the charging phase, the potential of terminal 14 rises to the threshold voltage of the series connected transistor $M_1$; thereby, $M_1$ turns "on", since $V_2$ is positive (in N-MOS technology) and the potential at terminal 12 is then at ground. Thus, the result is that the potential of terminal 12 rises to $V_2$.

On the other hand, the voltage drop across $C_1$ remains essentially at $V_1$, since $C_1$ is so much larger than the parasitic capacitance of terminal 14 to ground, and hence only a negligible amount of charge flows from the gate electrode of $C_1$ through $M_2$ to this terminal 14; therefore, the potential of output terminal 13 rises practically all the way to $(V_1+V_2)$, as does the potential of terminal 14; whereas the potential of terminal 15 rises to $(V_1+V_2)+V_1=(V_2+2V_1)$. Accordingly, $M_2$ remains "on", as does $M_1$ (since the thresholds of both of these are less than $V_1$) until the commencement of the very next "charging" phase when $M_3$, $M_4$, $M_5$, and $M_6$ turn "on" again. It is the rise in potential of output terminal 13 to $(V_1+V_2)$ which is characteristic of a "voltage adder" or one stage of a "voltage multiplier", both of which are forms of voltage converters.

It is obvious from the above description of operation that the feedback transistor $M_2$ could take the form of a load device of suitable impedance, thereby dispensing with the capacitor $C_2$ and its auxiliary transistor $M_6$. Such a load device could be simple resistor, or an MOS depletion mode transistor whose drain is permanently connected to its gate electrode.

FIG. 2 illustrates a first circuit stage 20 of a voltage multiplier MOS circuit, in accordance with another specific embodiment of the invention. Elements which are common to the circuit of FIGS. 1 and 2 have been given the same reference numerals. Basically, the circuit stage 20 of FIG. 2 is the same as the previously described stage 10 of FIG. 1 except that the control circuitry for providing the clock input sequences φ and Φ is shown in greater detail in FIG. 2.

In the circuit 20, the values of $V_1$ and $V_2$ are both taken to be equal to $+5$ volts (N-MOS technology) for convenience and simplicity. The semiconductor substrate voltage bias is typically $-5$ volts (back-gate bias); however, any substrate bias having between $-5$ volts and ground could be used. The clock input sequence φ as indicated in FIG. 2, is applied to a clock input terminal 21 in the form of a 5 volt pulse sequence, with typical rise and fall times of 50 nanoseconds, and pulse durations of 200 nanoseconds, thereby providing a clock period of 500 nanoseconds, that is, a 2 megahertz frequency clock. The clock input at terminal 17 is thus $+5$ volts during every "charging" phase when the auxiliary switching transistors are "on", and is 0 volt (ground) when these transistors are "off".

An MOS capacitor $C_3$ together with a pair of control MOS transistors $M_7$ and $M_8$ have been added in the circuit 20 (in comparison with the circuit 10) for the purpose of ensuring voltage levels for the sequence Φ appropriate for alternately turning "on" and "off" the transistors $M_5$ and $M_6$. The problem of ensuring these appropriate voltage levels arises from the fact that the voltage at output terminal 13 rises to $(V_2+V_1)$, the terminal 15 to $(V_2+2V_1)$ during the phase when the auxiliary switching transistors $M_5$ and $M_6$ are "off" thereby raising their threshold voltages for subsequent turning "on" to a value somewhat above $V_1=5$ volts, typically to about 6 volts; accordingly, the capacitor $C_3$ (in combination with $M_7$) bootstraps the clock pulse input at terminal 17 to a voltage sufficiently above 5 volts to turn "on" the transistors $M_5$ and $M_6$.

For example, after the first few or more cycles of the clock φ at the pulsed voltage clock input terminal 17, when the clock φ is "low", typically 0 volts, the transistor $M_7$ (acting as a diode) brings the voltage at the terminal 16 (gate electrode of $C_3$) to a level of typically 4 volts, i.e., $V_1(=5$ volts) less the threshold of $M_7(=1$ volt), just before the start of every "charging" phase. Thereafter, when the clock φ goes "high", i.e., to $+5$ volts, the capacitor $C_3$ bootstraps the voltage at terminal 16 typically to about $(4+5)$ or 9 volts, which is more than sufficient to ensure the turning "on" of the auxiliary transistors $M_5$ and $M_6$. Still later on, when the clock φ goes "low" i.e., back to 0, the voltage at terminal 16 returns to $V_1$ less the threshold of $M_7$, thereby turning "off" again the auxiliary transistors $M_5$ and $M_6$.

The purpose of the transistor $M_8$ is to prevent the voltage at terminal 16 from staying above the voltage $V_1$ plus a threshold of $M_8$ when the clock φ goes "low", that is, when the terminal 16 is supposed to be at a voltage suitable for turning "off" the auxiliary transistors $M_5$ and $M_6$. This problem, of the voltage at terminal 17 staying too high when the clock goes "low", is particularly acute where the overlap capacitance of terminal 16 with the output terminal 13 is appreciable, which is exacerbated by the presence of many stages and thus by more overlap capacitance as well as by even higher voltage on the output terminal 13 due to multistage voltage multiplication. When the clock φ goes "high", the transistor $M_8$ turns "on", thereby tending to reduce the voltage at terminal 16 to about $V_1$ plus a threshold of $M_8$ or to about 6 volts. Thus, when the clock φ subsequently goes "low", the voltage at terminal 16 goes down suddenly by about 5 volts, i.e., by the clock pulse height of φ, to a voltage of slightly over 1 volt, which is sufficiently low for turning "off" the transistors $M_5$ and $M_6$ even in the presence of overlap capacitance of terminal 17 with the output terminal 13 so long as this overlap capacitance is small as compared with the capacitance of the bootstrap capacitor $C_3$.

FIG. 3 illustrates a voltage multiplier circuit of four stages. Analogous elements (not necessarily of identical parameters) of succeeding stages are labeled with the same reference numerals or subscripts plus ten. At the output terminal 43 of the fourth stage an output transistor $M_{54}$ delivers the multiplier output $(V_2+4V_1)$, or typically $(5+4\times5=)25$ volts, to an output capacitor $(C_{51})$ at multiplier output terminal 61 only during the phases of φ when all the stages are mutually connected in series with the input voltage $V_2$ at input terminal 11, that is, when the transistors $M_1$, $M_{11}$, $M_{21}$, $M_{31}$, and $M_{54}$, are all "on". The output transistor $M_{54}$ serves to deliver output at the desired multiplied voltage level immediately after the charging phase without loss of any threshold voltage. Resistor $R_{51}$ represents a load element as a utilization means that conducts charge out of $C_{51}$ and transfers this charge to the ground terminal. Additional output transistors $M_{51}$, $M_{52}$, $M_{53}$ likewise furnish the output of the first, second, and third stages to the multiplier output terminal 61 only for the purpose of speeding up the transients, furnishing some output, albeit below the desired ultimate output voltage level, from the earlier, lower impedance stages. However, this later purpose is optional, so that these transistors $M_{51}$, $M_{52}$, and $M_{53}$ can be omitted, thereby connecting to the multiplier output terminal 61 only the output transistor $M_{54}$ and the output capacitor $C_{51}$.

For purposes of illustration only, an example of the various parameters for the components in FIG. 3 in N-MOS technology follows (transconductances of transistors, capacitances of capacitors, resistance of resistors):

$M_1 = 2000$ microamps/volts$^2$
$M_2 = 25$
$M_3 = 6750$
$M_4 = 250$
$M_5 = 6750$
$M_6 = 25$
$M_7 = 25$
$M_8 = 25$
$M_{11} = 1500$
$M_{12} = 25$
$M_{13} = 2250$
$M_{14} = 250$
$M_{15} = 2250$
$M_{16} = 25$
$M_{21} = 1000$
$M_{22} = 25$
$M_{23} = 750$
$M_{24} = 250$
$M_{25} = 750$
$M_{26} = 25$
$M_{31} = 1000$
$M_{32} = 25$
$M_{33} = 250$
$M_{34} = 250$
$M_{35} = 500$
$M_{36} = 25$
$M_{51} = 500$
$M_{52} = 500$
$M_{53} = 500$
$M_{54} = 500$
$C_1 = 270$ pf
$C_2 = 1$
$C_3 = 30$
$C_{11} = 90$
$C_{12} = 1$
$C_{21} = 30$
$C_{22} = 1$
$C_{31} = 10$
$C_{32} = 2$
$C_{51} = 100$
$R_{51} = 10$ megohm Although this invention has been described in detail in terms of specific embodiments, various modifications can be made without departing from the scope of the invention. For example, P-MOS (P-channel) technology can be used instead of N-MOS, with reversal of polarity of the various voltage applied to the circuit. Moreover, for example, although the ratio of the capacitances $C_1:C_{11}$ is equal to $270/90=3$ in the above illustrative example, this ratio can be made as low as about 1.2, at some sacrifice of transient time, however. Likewise, other components can be significantly varied from the above illustrative values without significantly deteriorating the operation.

We claim:

1. A semiconductor voltage converter circuit including a capacitor $(C_1)$ having a pair of terminals each of which is connected through the source-drain path of a separate MOS transistor switch $(M_3, M_5)$ to a separate first and second voltage source terminal (ground, $V_1$), for alternately connecting the disconnecting said capacitor $(C_1)$ to said first and second voltage source terminals (ground, $V_1$), one of said terminals of the capacitor $(C_1)$ being also connected through the source-drain path of a series-connected MOS transistor $(M_1)$ to a third input voltage source terminal $(V_2)$, the other of said terminals of the capacitor $(C_1)$ being connected to an output node (13), the gate electrode of said series-connected transistor $(M_1)$ being connected to another MOS transistor switch $(M_4)$ for alternately turning "on" and "off" said series-connected transistor $(M_1)$, characterized in that said circuit further includes a feedback loop running from the other terminal of said capacitor $(C_1)$ through a load $(M_2)$ back to the gate electrode of said series connected MOS transistor $(M_1)$.

2. A circuit in accordance with claim 1 further characterized in that said load $(M_2)$ is the source-drain path of an MOS transistor $(M_2)$ whose gate electrode is connected through the source-drain path of yet another MOS transistor $(M_6)$ to a voltage source terminal and to one terminal of a second, smaller capacitor $(C_2)$ having another terminal which is connected to the gate electrode of the series-connected transistor $(M_1)$.

3. A circuit according to claim 2 which further includes a bootstrap capacitor $(C_3)$ one of whose terminals is connected to the gate electrode of both the MOS transistors $M_5$ and $M_6$ and the other of whose terminals is connected to a pulsed voltage source terminal (17).

4. A circuit according to claim 3 in which the gate electrodes of both the MOS transistors $M_5$ and $M_6$ are connected to one of the high current carrying terminals of each of two additional MOS transistors ($M_7$ and $M_8$), the gate electrode of $M_8$ being connected to the gate electrodes of $M_5$ and $M_6$, the gate electrode of $M_7$ being connected to the other of the high current carrying terminals of $M_8$ and to the voltage source terminal $V_1$.

5. Semiconductor apparatus comprising:

(a) a first capacitor having first and second terminals, the second terminal being connected to an output node;

(b) a first transistor having a pair of high current terminals and a low current control terminal, one of said high current terminals connected to the first terminal of the first capacitor and the other of said high current terminals connected to an input voltage terminal, said control terminal connected through a load device to the second terminal of the first capacitor;

(c) first means, connected to said control terminal and said one of said high current terminals, for alternately turning "off" and "on" said first transistor;

(d) second means, connected to the second terminal of said first capacitor, for alternately connecting and disconnecting said second terminal of the first capacitor to and from a first voltage supply terminal.

6. Apparatus according to claim 5 in which the first capacitor is an MOS capacitor, the first transistor is an MOS transistor, and the load device is a second MOS transistor whose gate electrode is connected to its source through a second MOS capacitor.

7. Apparatus according to claim 6 in which the gate electrode of the second MOS transistor is connected to third means for alternately connecting and disconnecting said gate electrode of said second transistor to and from said first voltage supply terminal.

8. Apparatus according to claim 6 or 7 in which said first means comprise third and fourth MOS transistors, the drain of said third transistor being connected to said one of the high current carrying terminals of said first transistor, the drain of said fourth transistor being connected to the gate electrode of the first transistor and the gate electrodes of said third and fourth transistor being connected to means for alternately turning "off" and "on" said third and fourth transistors.

9. Apparatus according to claim 8 in which said second and third means comprise, respectively, fifth and sixth MOS transistors whose gate electrode are connected to an additional means for alternately turning "off" and "on" said fifth and sixth transistors, the sources of said fifth and sixth transistors being connected, respectively, to the second terminal of the first capacitor and the gate electrode of the second transistor.

10. Apparatus according to claim 9 which further includes a seventh MOS transistor and a third capacitor, the gate electrode of said seventh transistor being connected to its drain, the drain of the seventh transistor being conncted to the drain of the fifth transistor, the source of the seventh transistor being connected to one terminal of the third capacitor, the other terminal of the third capacitor being connected both to the gate electrode of the third transistor and to a pulsed voltage source terminal.

11. Apparatus according to claim 10 which further includes an eighth MOS transistor whose drain is connected to the drain of the seventh transistor and whose source and gate electrode are both connected to said one terminal of the third capacitor.

12. Apparatus according to claim 6 in which the capacitance of the first capacitor is larger than that of the second capacitor.

13. A voltage converter circuit stage comprising:

(a) a first MOS transistor, one of whose high current carrying terminals is connected to a first node, another of whose high current carrying terminals is connected to a stage input terminal, and whose low current carrying terminal is connected to a second node;

(b) a first capacitor having one of its terminals connected to said first node and another of its terminals connected to a stage output terminal;

(c) a second smaller capacitor having one of its terminals connected to said second node and another of its terminals connected to a third node;

(d) a second MOS transistor, one of whose high current terminals is connected to said second node, another of whose high current terminals is connected to said output terminal, and whose low current terminal is connected to said third node; and (e) first, second, third, and fourth switching means for alternately connecting and disconnecting respectively, said first node to and from a first reference potential terminal, said second node to and from said first reference potential terminal, said third node to and from a second reference potential terminal, said output node to and from said second reference potential terminal.

14. A voltage converter semiconductor circuit comprising:

(a) a plurality of successive stages each in accordance with the circuit stage recited in claim 13, the stage input terminal of each stage, except the first, being connected to the stage output terminal of the immediately preceding stage; and (b) an output MOS transistor, whose gate electrode is connected to the gate electrode of said second transistor of the last stage, one of whose high current carrying terminals is connected to the output terminal of the last stage and another of whose high current terminals is connected to a utilization meams terminal.

15. A voltage multiplier semiconductor circuit stage comprising:

(a) an input terminal;

(b) a first MOS transistor, one of whose high current carrying terminals is connected to said input terminal;

(c) a first MOS capacitor, one of whose terminals is connected to another high current carrying terminal of the first transistor;

(d) an output terminal to which is connected another terminal of the first capacitor;

(e) an MOS load device, one of its terminals connected to said another terminal of the first capacitor and another of its terminals connected to the gate electrode of the first transistor;

(f) first means for alternately connecting and disconnecting the gate electrode of said first transistor to and from a reference voltage terminal;

(g) second means for alternately connecting and disconnecting said one terminal of the first capacitor to and from said reference voltage terminal;

(h) third means for alternately connecting and disconnecting said another terminal of the first capacitor to a voltage supply terminal.

16. A circuit stage according to claim 15 in which said load device comprises a second MOS transistor, one of whose high current carrying terminals is connected to the output terminal and the other of whose high current terminals is connected to the gate electrode of the first transistor, and the said other high current terminal of the second transistor being connected to one terminal of a second capacitor, the gate electrode of said second transistor being connected both to another terminal of the second capacitor and to fourth means for alternately connecting and disconnecting said gate electrode of said second transistor to said voltage supply terminal.

17. A voltage multiplier semiconductor circuit comprising:

(a) a plurality of successive stages each in accordance with claim 16;

(b) stage interconnecting means for connecting the output terminal of each stage, except the last, to the input terminal of the immediately succeeding stage;

(c) output means for alternately connecting and disconnecting the output terminal of the last stage to a utilization means terminal.

18. A circuit according to claim 17 in which said output means includes an output MOS transistor whose gate electrode is connected to the gate electrode of the second transistor of the last stage, one of the high current carrying terminals of the output transistor being connected to said utilization means terminal and another of the high current carrying terminals of the output transistor being connected to the output terminal of the last stage.

* * * * *

UNITED STATES PATENT AND TRADEMARK OFFICE
CERTIFICATE OF CORRECTION

PATENT NO. : 4,275,437
DATED : June 23, 1981
INVENTOR(S) : Harry J. Boll and Dennis J. Lynes It is certified that error appears in the above-identified patent and that said Letters Patent are hereby corrected as shown below:

Column 1, line 45, "a" should read --the--.
Column 5, line 30, "later" should read --latter--.
Column 6, line 31, "the" should read --and--.
Column 6, line 36, "third input" should read --third, input--.
Column 7, line 41, "electrode" should read --electrodes--.

Signed and Sealed this

Twenty-ninth Day of September 1981

[SEAL]

Attest:

GERALD J. MOSSINGHOFF

Attesting Officer

Commissioner of Patents and Trademarks